United States Patent [19]

Matsuki et al.

[11] Patent Number: 5,525,933
[45] Date of Patent: Jun. 11, 1996

[54] SEMICONDUCTOR INTEGRATED CIRCUIT

[75] Inventors: Shigeru Matsuki; Kazuhiro Sugita, both of Yokohama, Japan

[73] Assignee: Kabushiki Kaisha Toshiba, Kawasaki, Japan

[21] Appl. No.: 392,119

[22] Filed: Feb. 22, 1995

[30] Foreign Application Priority Data

Feb. 28, 1994 [JP] Japan .................................. 6-029194

[51] Int. Cl.⁶ .......................... H03K 5/08; H03K 17/16
[52] U.S. Cl. .......................... 327/309; 327/314; 327/389; 326/23
[58] Field of Search .................................. 327/309, 314, 327/389, 391, 530, 535, 537, 538, 541; 326/33, 34, 23

[56] References Cited

U.S. PATENT DOCUMENTS

| | | | |
|---|---|---|---|
| 4,617,482 | 10/1986 | Matsuda | 327/391 |
| 5,138,190 | 8/1992 | Yamazaki et al. | 365/189.11 |
| 5,175,445 | 12/1992 | Kinugasa et al. | 326/34 |
| 5,239,207 | 8/1993 | Miyamoto et al. | 327/530 |
| 5,247,213 | 9/1993 | Trinh et al. | 327/541 |
| 5,386,153 | 1/1995 | Voss et al. | 326/34 |
| 5,399,960 | 3/1995 | Gross | 327/541 |
| 5,432,463 | 7/1995 | Wong et al. | 326/34 |

Primary Examiner—David C. Nelms
Assistant Examiner—Trong Phan
Attorney, Agent, or Firm—Oblon, Spivak, McClelland, Maier & Neustadt

[57] ABSTRACT

A semiconductor integrated circuit comprises a signal input terminal, a power supply voltage terminal to which a power voltage is applied, a reference voltage terminal to which a ground voltage is applied, a first PMOS transistor having a drain, a gate connected to the signal input terminal, and a source connected to the power supply voltage terminal, a second PMOS transistor having a gate and a drain being mutually connected to each other, and a source connected to the drain of the first transistor, a third PMOS transistor having a gate connected to the drain of the second transistor, a source connected to the power supply potential terminal, and a drain connected to the drain of the first transistor, an NMOS transistor having a gate connected to the power supply voltage terminal, a drain connected to the drain of the second PMOS transistor, and a source connected to the reference voltage terminal, an internal circuit connected to the drain of the NMOS transistor, a first overvoltage absorption element, connected between the reference voltage terminal and the signal input terminal, for absorbing an overvoltage applied to the signal input terminal, and a second overvoltage absorption element, connected between the signal input terminal and the power supply voltage terminal, for absorbing an overvoltage applied to the signal input terminal.

9 Claims, 3 Drawing Sheets

SEMICONDUCTOR INTEGRATED CIRCUIT

BACKGROUND OF THE INVENTION

1. Field of the Invention

The present invention relates to a semiconductor integrated circuit and more particularly to improvement of a MOS input circuit.

2. Description of the Related Art

MOS circuits such as MOSIC or MOSLSI are frequently used, for example, as logic circuits each including a semiconductor memory, an inverter, etc. Each MOS circuit is formed by integrating MOSFETs each having an insulated gate electrode. However, such a MOS circuit is weak in insulation breakdown, and if a voltage, which is more than a rated voltage, is applied onto the MOS circuit, the MOS circuit is easily broken. In other words, if an overvoltage such as surge is applied onto an input terminal of the MOS circuit such as a CMOS circuit and a BiCOMS circuit and an overcurrent continues to flow, there is a case that a semiconductor device will be broken. Due to this, an overvoltage absorption element is generally provided at a signal input terminal.

In an input circuit portion of a conventional MOS integrated circuit, as shown in FIG. 1, an input node of an input gate circuit 51 such as a CMOS inverter circuit is connected to a signal input terminal 11 such as a bonding pad. Then, an overvoltage absorption element is connected to the input node. The overvoltage absorption element is structured such that a PMOS transistor 52 in which a gate and a source are mutually connected is connected between a power source voltage (Vcc) terminal and the signal input terminal 11, and an NMOS transistor 53 in which a gate and a source are mutually connected is connected between the signal input terminal 11 and a ground voltage (Vss) terminal.

In the input circuit portion, it is assumed that a forward voltage of a PN junction between a drain region and a substrate of the PMOS transistor 52 for over-voltage absorption is expressed by Vf. If a voltage whose level is higher than a voltage which is the sum of the forward voltage Vf and the power supply voltage Vcc (e.g., 5 V) is inputted to the signal input terminal 11, the input voltage, which is limited to (Vcc+Vf), is inputted to each gate of a PMOS transistor P1 and an NMOS transistor N1 of the CMOS inverter circuit 51. At this time, a potential difference between the gate and the source of the PMOS transistor P1 of the CMOS inverter circuit 51 is Vf. In contrast, the input voltage is directly applied between the gate and the source of the NMOS transistor N1 of the CMOS inverter circuit 51, and the potential difference between the source and the gate is (Vcc+Vf). Similarly, (Vcc+Vf) is applied between the drain and the gate of the overvoltage absorption element 53.

By the way, for example, a burn-in test, which is performed in a product qualification test of IC or a screening test in a manufacturing process thereof, is an acceleration test in which voltage stress and thermal stress are simultaneously added so as to assure thermal breakdown of a junction of the MOS transistor. On the other hand, it is difficult to assure long-time reliability between the source and the gate or between the drain and the gate by the present voltage/thermal acceleration test wherein a high voltage, which is more than a rated voltage, is applied onto a gate oxide film of the MOS transistor.

The breakdown of the gate oxide film depends on a gate material of the MOS transistor such as polycrystalline silicon and an electrical charge amount of a gate channel portion. A portion where the electrical charge is concentrated differs depending on the position on the same semiconductor wafer and its tendency is unclear. Therefore, it is extremely difficult to take measures against the concentration of the electrical charge in the manufacturing process. Due to this, there has been desired means for assuring reliability when the high voltage, which is higher than the rated voltage, is applied onto the gate oxide film for a long period time.

SUMMARY OF THE INVENTION

An object of the present invention is to provide a semiconductor integrated circuit having an input circuit portion, which can prevent a gate oxide film of an input gate circuit from being broken even if a high voltage, which is higher than a rated voltage, is applied onto a signal input terminal for a long period time.

In order to attain the above object, there is provided a semiconductor integrated circuit comprising a signal input terminal; a power supply voltage terminal to which a power supply voltage is applied; a reference voltage terminal to which a ground voltage is applied; a first PMOS transistor having a drain, a gate connected to the signal input terminal, and a source connected to the power supply voltage terminal; a second PMOS transistor having a gate and a drain being mutually connected to each other, and a source connected to the drain of the first transistor; a third PMOS transistor having a gate connected to the drain of the second transistor, a source connected to the power supply voltage terminal, and a drain connected to the drain of the first transistor; an NMOS transistor having a gate connected to the power supply voltage terminal, a drain connected to the drain of the second PMOS transistor, and a source connected to the reference voltage terminal; an internal circuit connected to the drain of the NMOS transistor; a first overvoltage absorption element, connected between the reference voltage terminal and the signal input terminal, for absorbing an overvoltage applied to the signal input terminal; and a second overvoltage absorption element, connected between the signal input terminal and the power supply voltage terminal, for absorbing an overvoltage applied to the signal input terminal.

when the input voltage applied to the signal input terminal is received by the first PMOS transistor and transmitted to the internal circuit, an upper limit of the input voltage is limited to a voltage which is the sum of a forward voltage Vf of a PN junction provided in the overvoltage absorption element and the power supply voltage Vcc owing to the overvoltage absorption element.

Therefore, a potential difference between the gate and the source of the first PMOS transistor is only Vf. Even if a high voltage is applied onto the input terminal for a long period of time, the gate oxide film of the input gate circuit can be prevented from being broken, and reliability of the input circuit portion can be ensured. In this case, since the high voltage is not applied onto the gate, there is no possibility that the gate oxide film will be broken.

The desirable embodiment of this invention is that at least a diode having a predetermined withstanding voltage is used as a first overvoltage absorption element. Moreover, when on-resistance of said first PMOS transistor is RP1(ON), on-resistance of said second PMOS transistor is RP2(ON), on-resistance of said third PMOS transistor is RP3(ON), on-resistance of said NMOS transistor is RN1(ON), and said power supply potential is VCC, the relationship, RP1(ON)+

RP2(ON)<RN1(ON)<RP3(ON)+RP2(ON), is set to be established, and a circuit threshold of said internal circuit is set to be substantially the same as ½ VCC.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
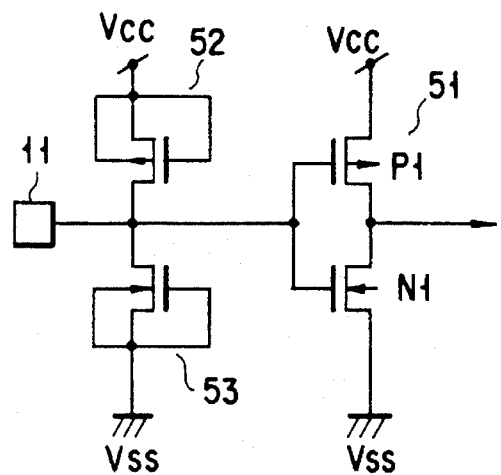
FIG. 1 is a circuit diagram showing an input circuit portion of a conventional MOS integrated circuit.

The following will explain the embodiments of the present invention with reference to the drawings. The same reference numerals are added to the common portions through the following embodiments, and the same explanation is omitted.
(First Embodiment)

Figure 2:
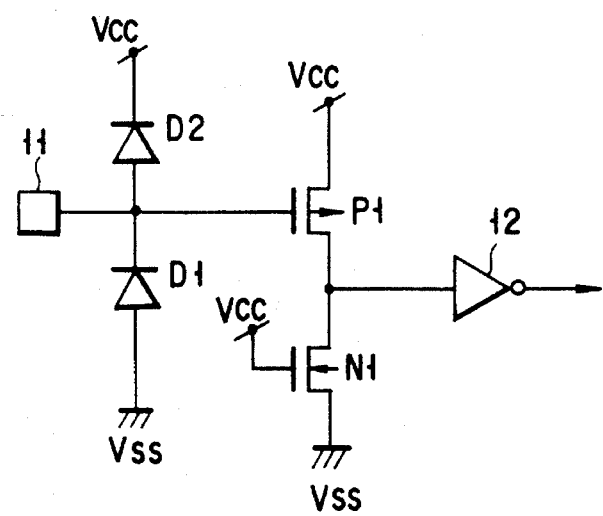
FIG. 2 is a circuit diagram explaining a basic concept of an input circuit portion of a MOS integrated circuit of a first embodiment of the present invention.
Figure 3:
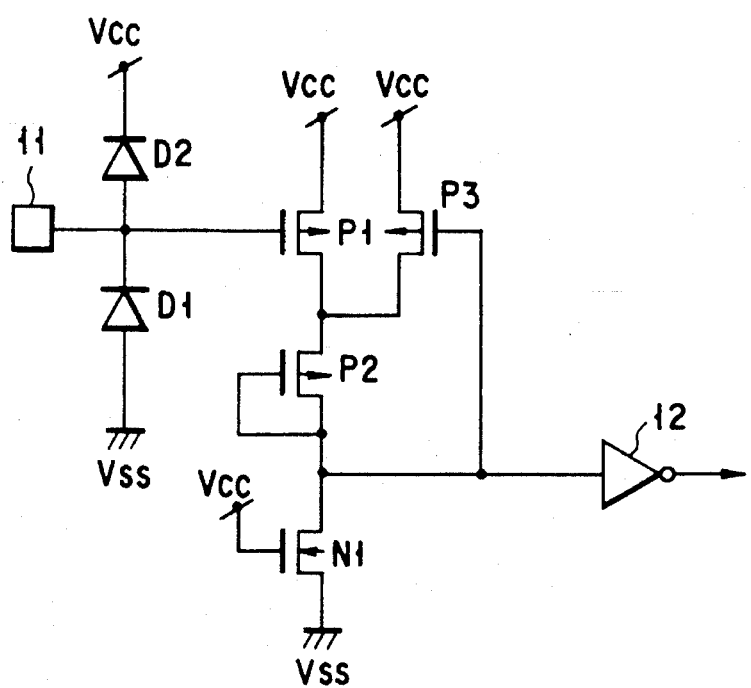
FIG. 3 is a circuit diagram showing the input circuit portion of the MOS integrated circuit of the first embodiment.

FIG. 2 is a circuit diagram explaining a basic concept of an input circuit portion of a MOS integrated circuit of a first embodiment of the present invention, and FIG. 3 is a circuit diagram showing the input circuit portion of the MOS integrated circuit of the first embodiment.

In the input circuit portion of FIG. 2, reference numeral 11 is a signal input terminal (for example, bonding pad). P1 is a first PMOS transistor for input in which a gate is connected to the signal input terminal and a source is connected to a power supply voltage (VCC). N1 is an NMOS transistor, which is provided between a drain of the PMOS transistor P1 and a reference voltage (VSS) terminal to which a ground voltage is applied, and whose gate is connected to the Vcc terminal. Reference numeral 12 is an internal circuit (for example, CMOS inverter), which is connected to the drain of the first PMOS transistor P1. D1 is a first overvoltage absorption element, which is connected between the VSS terminal and the signal input terminal 11, being comprised of a diode having an anode connected to a VSS node and a cathode connected to the signal input terminal 11. D2 is a second overvoltage absorption element, which is connected between the signal input terminal 11 and the VCC terminal, being comprised of a diode having an anode connected to the signal terminal 11 and a cathode connected to the VCC terminal.

In the above-structured input circuit portion, an input voltage to be applied to the signal input terminal 11 is received by the PMOS transistor P1, and transmitted to the internal circuit 12. In a case where the ground voltage Vss is inputted to the input terminal 11, the PMOS transistor P1 is set to be an ON state. On the other hand, since the gate of the NMOS transistor N1 is connected to the Vcc terminal, the NMOS transistor N1 is always set to be an ON state. However, these transistor characteristics are set such that an on-resistance of the NMOS transistor N1 is higher than that of the PMOS transistor P1 and a circuit threshold of the internal circuit 12 is set to be ½ Vcc or less. Thereby, inversion data (H level) of the input voltage (L level) is transmitted to the internal circuit 12 through the PMOS transistor P1.

On the other hand, in a case where the power supply voltage Vcc is inputted to the signal input terminal 11, the PMOS transistor P1 is set to be an OFF state. At this time, since the NMOS transistor N1 is set to be on ON state, the voltage (L level) of the Vss terminal is transmitted to the internal circuit 12 through the NMOS transistor N1. In other words, inversion data of the input voltage (H level) is transmitted to the internal circuit 12.

On the other hand, if the forward voltage of the second diode D2 for overvoltage absorption is expressed by Vf, an input voltage, which is limited to ((Vcc+Vf) is inputted to the gate of the PMOS transistor P1 in a case where a voltage, which is higher than a voltage which is the sum of Vf and the power supply voltage Vcc (for example, 5 V) is inputted to the signal input terminal 11. At this time, the PMOS transistor P1 is in an Off state since a potential difference between the gate and source is Vf, and the NMOS transistor N1 is in an on state since the gate is connected to the Vcc terminal.

In other words, according to the above-mentioned input circuit portion, the upper limit of the input voltage is limited to (Vcc+Vf) by the PMOS transistor P1. Therefore, the potential difference between the gate and the source of the PMOS transistor P1 is only Vf. Even in a case where a high voltage is applied to the input terminal 11 for a long period of time, thermal breakdown of the gate oxide film can be prevented, and reliability of the input circuit portion can be ensured. In this case, in the NMOS transistor N1, since only VCC, which is a rated voltage, is applied to the gate, there is no possibility that the gate oxide film will be broken. Moreover, a breakdown voltage, which is reversely applied to the first diode D1, is set to a predetermined voltage, which is higher than (VCC+Vf), so that the first diode D1 is not broken.

However, in the circuit of FIG. 2, in a case where mutual conductance between the PMOS transistor P1 and the NMOS transistor N1 is set to have the same characteristic as the normal CMOS inverter, the following disadvantage is generated when the input voltage, which is limited to (Vcc+Vf), is inputted to the gate of the PMOS transistor P1.

More specifically, at the time when the input voltage, which is limited to (Vcc+Vf), is inputted to the gate of the PMOS transistor P1, the PMOS transistor P1 is turned off and the NMOS transistor N1 is turned on, and the drain of the NMOS transistor N1 is biased at a Vss voltage. Due to this, the potential difference, which exceeds the rated voltage (Vcc+Vf), is unfavorably generated between the input terminal 11 and the drain of the NMOS transistor N1, that is, between the gate and the drain of the PMOS transistor P1.

FIG. 3 shows the input circuit portion of the first embodiment, which is provided to avoid generating the above-mentioned disadvantage. A second PMOS transistor P2 is inserted between the drain of the first PMOS transistor P1 and the drain of the NMOS transistor N1. Also, a source and a drain of a third PMOS transistor P3 are connected to the Vcc terminal and the drain of the first PMOS transistor P1, respectively, and the gate is connected to the drain of the NMOS transistor N1. The second PMOS transistor P2 is for input voltage shift, and the gate and the drain thereof are mutually connected to each other.

In the input circuit portion of FIG. 3, when the input voltage, which is limited to (Vcc+Vf), is inputted to the gate of the first PMOS transistor P1, the first PMOS transistor P1 is turned off and the NMOS transistor N1 is turned on. Due to this, a current flows into the third PMOS transistor P3 whose gate is biased to Vss of the drain potential of the NMOS transistor N1 and the second PMOS transistor P2. As a result, the voltage of the drain of the PMOS transistor P1 is increased by the amount of on-resistance of the second PMOS transistor P2. The voltage drop in the on-resistance thereof, which is substantially the same as Vf, cancels Vf. Moreover, since the voltage drop in the on-resistance of the NMOS transistor N1 is added thereto, the potential difference between the gate and the drain of the PMOS transistor P1 is reduced to Vcc or less.

In the above-mentioned input circuit portion, for setting an input node of the internal circuit 12 to be in an L level when a signal level of the signal input terminal 11 is in an H level, the sum of on-resistance RP2(ON) of the second PMOS transistor and on-resistance RP3(ON) of the third PMOS transistor P3 must be larger than on-resistance RN1(ON) of the NMOS transistor N1. In a case where the signal level of the input signal terminal 11 is in an L level, the sum of on-resistance RP1(ON) of the first PMOS transistor P1 and RP2 (ON) of the second PMOS transistor P2 must be smaller than on-resistance RN1(ON) of the NMOS transistor N1. The above relationship can be expressed by the following inequality:

$$RP1(ON)+RP2(ON)<RN1(ON)<RP3(ON)+RP2(ON)$$

At this time, the circuit threshold of the internal circuit 12 is desirably set to ½ VCC.

Figure 4:
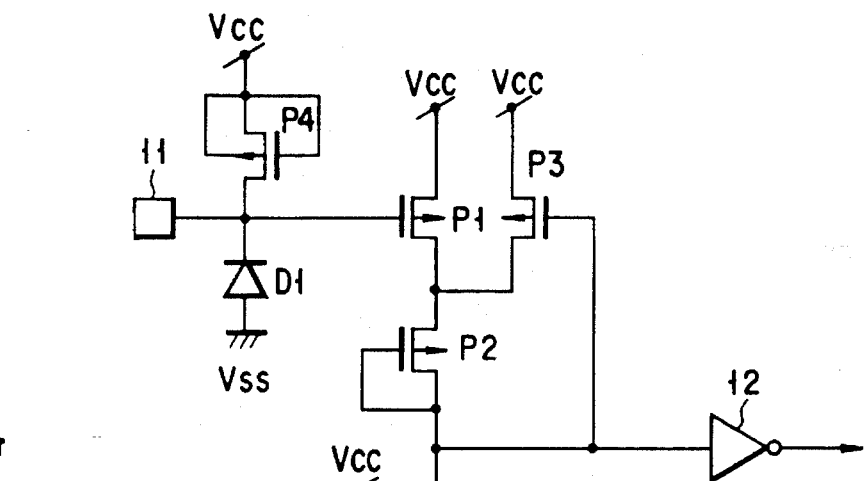
FIG. 4 is a circuit diagram showing an input circuit portion of a MOS integrated circuit of a modification of the first embodiment.

In the above-mentioned embodiment, two diodes were used as overvoltage absorption elements. However, the PMOS transistor may be used as a second overvoltage absorption element to be connected between the signal input terminal 11 and the VCC node as shown in FIG. 4 since there is no possibility that the voltage, which is higher than the rated voltage, will be applied to the gate oxide film of the transistor on the VCC side. In FIG. 4, a source of a fourth PMOS transistor P4 in which the source and the gate are mutually connected to each other is connected to the power supply voltage VCC terminal, and the drain is connected to the signal input terminal 11.

(Second Embodiment)

Figure 5:
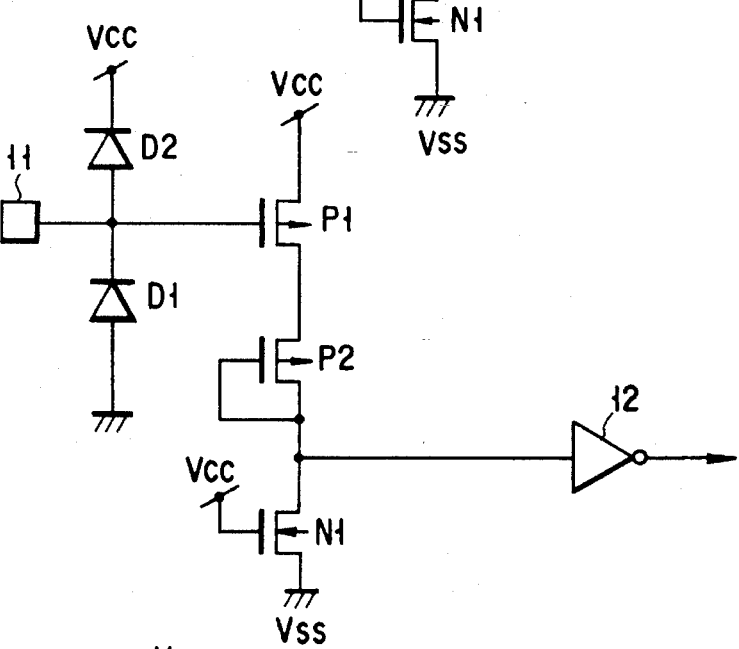
FIG. 5 is a circuit diagram showing an input circuit portion of a MOS integrated circuit of a second embodiment of the present invention.

FIG. 5 is a circuit diagram showing an input circuit portion of a MOS integrated circuit of a second embodiment of the present invention. The circuit of the second embodiment corresponds to a circuit in which the third PMOS transistor P3 of the first embodiment is omitted.

According to the second embodiment, in a case where the ground voltage Vss is inputted to the input terminal 11, the first PMOS transistor P1 is in an ON state. On the other hand, since the gate of the NMOS transistor N1 is connected to the Vcc terminal, the transistor N1 is always in the ON state. However, these transistor characteristics are set such that the voltage drop in on-resistance RN1(ON) of the NMOS transistor N1 is higher than the sum of Vf of the second PMOS transistor P2 and the voltage drop in on-resistance RP1(ON) of the first PMOS transistor P1. Also, the circuit threshold of the internal circuit 12 is set to be ½ Vcc or less. Thereby, inversion data (H level) of the input voltage (L level) is transmitted to the internal circuit 12 through the PMOS transistor P1. The above relationship in on-resistance of each transistor in the above operation can be expressed by the following inequality:

$$RP1(ON)+RP2(ON)<RN1(ON)$$

On the other hand, if the high voltage is inputted to the signal input terminal 11 and the input voltage, which is limited to (Vcc+Vf), is inputted to the gate of the first PMOS transistor P1, the first PMOS transistor P1 is in the Off state, and the NMOS transistor N1 is in the ON state. However, the drain voltage of the first PMOS transistor P1 is increased by threshold Vth of the second PMOS transistor P2. Vf, which is added to the gate of the first transistor P1, is canceled by the threshold Vth. As a result, the potential difference between the gate and the drain of the first PMOS transistor P1 is reduced to Vcc, and reliability of the input circuit portion can be ensured.

(Third Embodiment)

Figure 6:
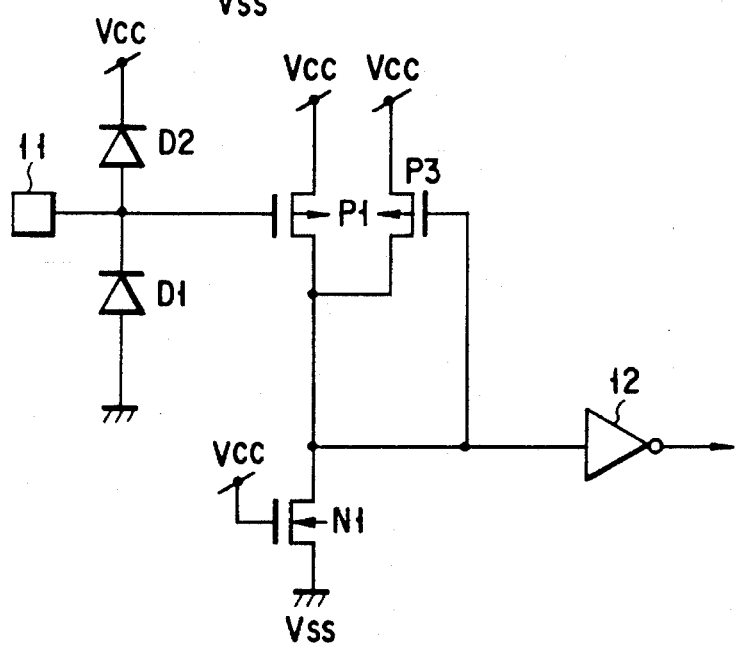
FIG. 6 is a circuit diagram showing an input circuit portion of a MOS integrated circuit of a third embodiment of the present invention.

FIG. 6 is a circuit diagram showing an input circuit portion of a MOS integrated circuit of a third embodiment of the present invention. The circuit of the third embodiment corresponds to a circuit in which the fourth PMOS transistor P4 of the first embodiment is omitted.

According to the third embodiment, in a case where the ground voltage Vss is inputted to the input terminal 11, the first PMOS transistor P1 is in an ON state. On the other hand, since the gate of the NMOS transistor N1 is connected to the Vcc terminal, the transistor N1 is always in an ON state. However, these transistor characteristics are set such that on-resistance RN1(ON) of the transistor N1 is higher than on-resistance RP1(ON) of the first transistor P1. Also, the threshold of the internal circuit 12 is set to be ½ Vcc or less. Thereby, inversion data (H level) of the input voltage (L level) is transmitted to the internal circuit 12 through the PMOS transistor P1.

On the other hand, if the high voltage is inputted to the signal input terminal 11 and the input voltage, which is limited to (Vcc+Vf), is inputted to the gate of the first PMOS transistor P1, the first PMOS transistor P1 is in an Off state, and the NMOS transistor N1 is in an ON state. Then, the third PMOS transistor P3 whose gate is connected to the source of the NMOS transistor N1 is also in an ON state. As a result, a current flows into the NMOS transistor N1, and a drop voltage, which is based on on-resistance RN1(ON), is generated. Since the drop voltage is substantially the same as the forward voltage Vf, which is applied to the diode D2, Vf, which is added to the gate of the PMOS transistor P1, is canceled. As a result, the potential difference between the gate and the drain of the PMOS transistor P1 is reduced to Vcc, and reliability of the input circuit portion can be ensured. However, in this case, the characteristic of each transistor is set such that on-resistance RP3(ON) of the third PMOS transistor P3 is larger than on-resistance RN1(ON) of the NMOS transistor.

The above relationship in on-resistance of each transistor in the above operation can be expressed by the following inequality:

$$RP1(ON) < RN1(ON) < RP1(ON)$$

(Fourth Embodiment)

Figure 7:
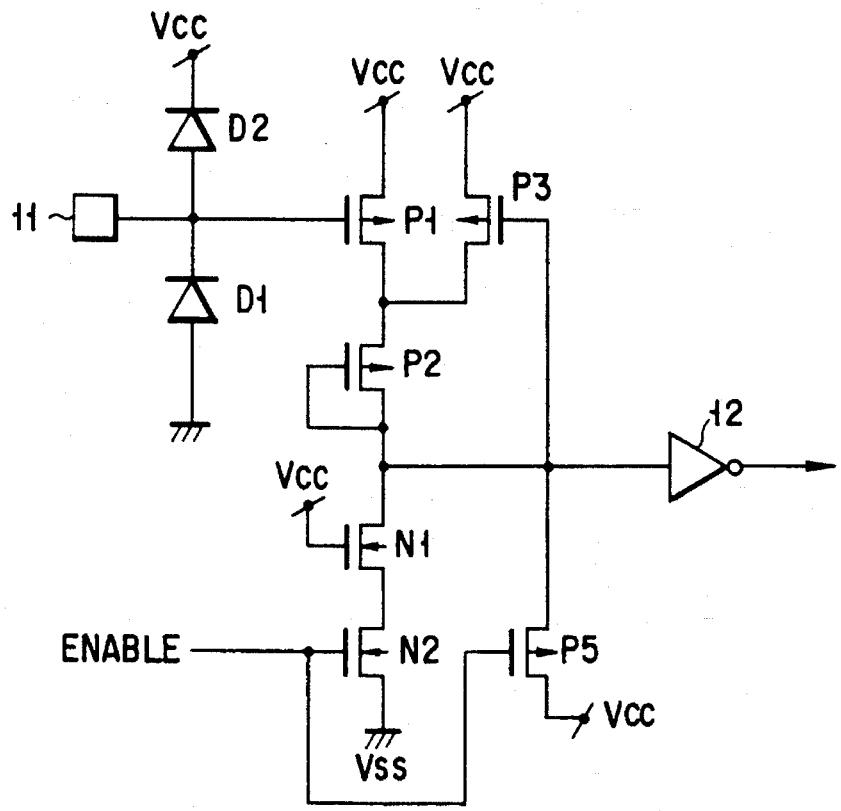
FIG. 7 is a circuit diagram showing an input circuit portion of a MOS integrated circuit of a fourth embodiment of the present invention wherein an enable control function is provided.

FIG. 7 is a circuit diagram showing an input circuit portion of a MOS integrated circuit of a fourth embodiment of the present invention wherein an enable control function is provided. According to the input circuit portion of this embodiment, the following structure is added to the input circuit portion of FIG. 3.

A second NMOS transistor N2 for enable control is connected between the source of the NMOS transistor N1 and the ground voltage Vss terminal, and an enable control signal is applied to the gate. Moreover, a fifth PMOS transistor P5 for enable control is connected between the power supply Vcc terminal and the drain of the first PMOS transistor R5, and the enable control signal is applied to the gate.

In the above input circuit portion, when an enable control signal ENABLE is in an "H" level, the second NMOS transistor N2 is turned on, and the fifth PMOS transistor P5 is turned off, so that the same operation as the input circuit portion of the first embodiment is performed. In contrast, when an enable control signal ENABLE is in an "L" level, the second NMOS transistor N2 is turned off, and the fifth PMOS transistor P5 is turned on, so that the drain potential of the NMOS transistor N1 is increased.

(Fifth Embodiment)

Figure 8:
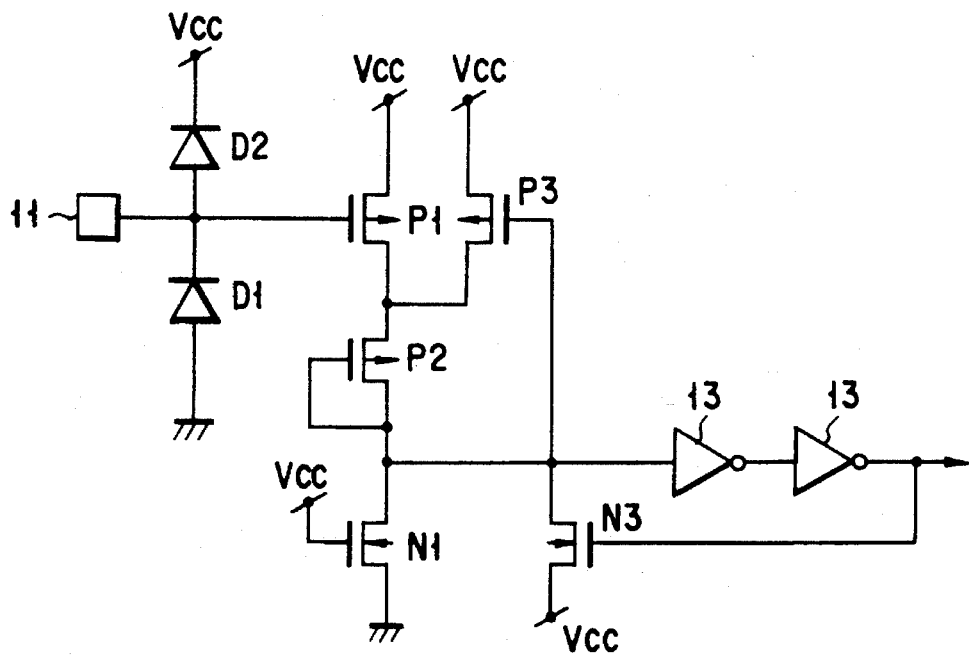
FIG. 8 is a circuit diagram showing an input circuit portion of a MOS integrated circuit of a fifth embodiment of the present invention wherein a Schmitt input circuit is provided.

FIG. 8 is a circuit diagram showing an input circuit portion of a MOS integrated circuit of a fifth embodiment of the present invention wherein a Schmitt input circuit is provided. According to the input circuit portion of this embodiment, the following structure is added to the input circuit portion of FIG. 3. A third NMOS transistor N3 is connected between the power supply Vcc terminal and the drain of the NMOS transistor N1, and a control signal, which is delayed through two stages of the inverter 13 from the drain of the first NMOS transistor N1, is inputted to the gate.

As shown in the fourth and fifth embodiments, according to the input circuit portion of the present invention, the combination with the other functions in addition to the input protection can be easily attained. As explained in the first to third embodiments, according to the present invention, there can be realized the input circuit portion, which can prevent the gate oxide film of the input gate circuit from being broken even if a high voltage is applied onto the input terminal of the semiconductor integrated circuit for a long period time.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:

a signal input terminal;

a power supply voltage terminal to which a power supply voltage is applied;

a reference voltage terminal to which a ground voltage is applied;

a first PMOS transistor having a drain, a gate connected to said signal input terminal, and a source connected to said power supply voltage terminal;

a second PMOS transistor having a gate and a drain being mutually connected to each other, and a source connected to said drain of said first transistor;

a third PMOS transistor having a gate connected to said drain of said second transistor, a source connected to said power supply voltage terminal, and a drain connected to the drain of said first transistor;

an NMOS transistor having a gate connected to said power supply voltage terminal, a drain connected to said drain of said second PMOS transistor, and a source connected to said reference voltage terminal;

an internal circuit connected to said drain of said NMOS transistor;

a first overvoltage absorption element, connected between said reference voltage terminal and said signal input terminal, for absorbing an overvoltage applied to said signal input terminal; and a second overvoltage absorption element, connected between said signal input terminal and said power supply voltage terminal, for absorbing an overvoltage applied to said signal input terminal wherein when on-resistance of said first PMOS transistor is RP1(ON), on-resistance of said second PMOS transistor is RP2(ON), on-resistance of said third PMOS transistor is RP3(ON), on-resistance of said NMOS transistor is RN1(ON), and said power supply voltage is VCC, the following relation is set to be established:

RP1(ON)+RP2(ON) < RN1(ON) < RP3(ON)+RP2(ON), and a circuit threshold voltage of said internal circuit is substantially the same a ½ VCC.

2. A semiconductor integrated circuit according to claim 1, wherein said first overvoltage absorption element is a diode.

3. A semiconductor integrated circuit according to claim 1, wherein said first and second overvoltage absorption elements are diodes.

4. A semiconductor integrated circuit comprising:

a signal input terminal;

a power supply voltage terminal to which a power supply voltage is applied;

a reference voltage terminal to which a ground voltage is applied;

a first PMOS transistor having a drain, a gate connected to said signal input terminal, and a source connected to said power supply voltage terminal;

a second PMOS transistor having a gate and a drain being mutually connected to each other, and a source connected to said drain of said first transistor;

an NMOS transistor having a gate connected to said power supply voltage terminal, a drain connected to said drain of said second PMOS transistor, and a source connected to said reference voltage terminal;

an internal circuit connected to said drain of said NMOS transistor;

a first overvoltage absorption element, connected between said reference voltage terminal and said signal input terminal, for absorbing an overvoltage applied to said signal input terminal; and a second overvoltage absorption element, connected between said signal input terminal and said power supply voltage terminal, for absorbing an overvoltage applied to said signal input terminal wherein when on-resistance of said first PMOS transistor is RP1(ON), on-resistance of said second PMOS transistor is RP2(ON), on resistance of said NMOS transistor is RN1(ON), and said power supply voltage is VCC, the following relation is set to be established:

RP1(ON)+RP2(ON)<RN1(ON), and a circuit threshold voltage of said internal circuit is ½ VCC or less.

5. A semiconductor integrated circuit according to claim 4, wherein said first overvoltage absorption element is a diode.

6. A semiconductor integrated circuit according to claim 4, wherein said first and second overvoltage absorption elements are diodes.

7. A semiconductor integrated circuit comprising:

a signal input terminal;

a power supply voltage terminal to which a power supply voltage is applied;

a reference voltage terminal to which a ground voltage is applied;

a first PMOS transistor having a drain, a gate connected to said signal input terminal, and a source connected to said power supply voltage terminal;

a second PMOS transistor having a gate connected to said drain of said first transistor, a source connected to said power supply voltage terminal, and a drain connected to the drain of said first transistor;

an NMOS transistor having a gate connected to said power supply voltage terminal, a drain connected to said drain of said second PMOS transistor, and a source connected to said reference voltage terminal;

an internal circuit connected to said drain of said NMOS transistor;

a first overvoltage absorption element, connected between said reference voltage terminal and said signal input terminal, for absorbing an overvoltage applied to said signal input terminal; and a second overvoltage absorption element, connected between said signal input terminal and said power supply voltage terminal, for absorbing an overvoltage applied to said signal input terminal wherein when on-resistance of said first PMOS transistor RP1(ON), on-resistance of said second PMOS transistor is RP2(ON), on-resistance of said NMOS transistor is RN1(ON), and said power supply voltage is VCC, the following relation is set to be established:

RP1(ON)<RN1(ON)<RP2(ON), and a circuit threshold voltage of said internal circuit is substantially the same as ½ VCC.

8. A semiconductor integrated circuit according to claim 7, wherein said first overvoltage absorption element is a diode.

9. A semiconductor integrated circuit according to claim 7, wherein said first and second overvoltage absorption elements are diodes.

* * * * *